US011201251B2

(12) United States Patent
Pao et al.

(10) Patent No.: US 11,201,251 B2
(45) Date of Patent: Dec. 14, 2021

(54) HIGH SPEED PHOTO DETECTORS WITH REDUCED APERTURE METAL CONTACT AND METHOD THEREFOR

(71) Applicant: OEPIC SEMICONDUCTORS, INC., Sunnyvale, CA (US)

(72) Inventors: Yi-Ching Pao, Sunnyvale, CA (US); Majid Riaziat, Sunnyvale, CA (US); Ta-Chung Wu, Sunnyvale, CA (US)

(73) Assignee: OEPIC SEMICONDUCTORS, INC., Sunnyvale, CA (US)

( * ) Notice: Subject to any disclaimer, the term of this patent is extended or adjusted under 35 U.S.C. 154(b) by 0 days.

(21) Appl. No.: 16/782,788

(22) Filed: Feb. 5, 2020

(65) Prior Publication Data

US 2020/0411703 A1 Dec. 31, 2020

Related U.S. Application Data

(60) Provisional application No. 62/777,851, filed on Dec. 11, 2018.

(51) Int. Cl.
*H01L 29/66* (2006.01)
*H01L 21/332* (2006.01)
*H01L 31/0224* (2006.01)
*H01L 31/0352* (2006.01)
*H01L 31/105* (2006.01)

(52) U.S. Cl.
CPC ........... *H01L 31/022408* (2013.01); *H01L 31/035281* (2013.01); *H01L 31/105* (2013.01)

(58) Field of Classification Search
CPC .................................. H01L 31/022416
USPC .................... 438/140; 257/127, 484
See application file for complete search history.

(56) References Cited

U.S. PATENT DOCUMENTS

| 5,332,919 | A | * | 7/1994 | Fujimura | H01L 31/0203 257/434 |
| 6,384,459 | B1 | * | 5/2002 | Matsuda | H01L 31/1804 257/435 |
| 8,022,495 | B2 | * | 9/2011 | Gao | H01L 31/105 257/461 |
| 2020/0052142 | A1 | * | 2/2020 | Udono | H01L 31/103 |

* cited by examiner

*Primary Examiner* — Calvin Lee
(74) *Attorney, Agent, or Firm* — Weiss & Moy, P.C.; Jeffrey D. Moy

(57) ABSTRACT

A photodiode has a substrate. A mesa structure is formed on the substrate, wherein the mesa structure has an n region containing an n type dopant formed on the substrate, an intermediate region positioned on the n region and a p region formed on the intermediate region and containing a p type dopant. A contact is formed on a top surface of the mesa and attached to the p region. The contact is formed around an outer perimeter of the mesa. The mesa has a diameter of 30 um or less.

14 Claims, 5 Drawing Sheets

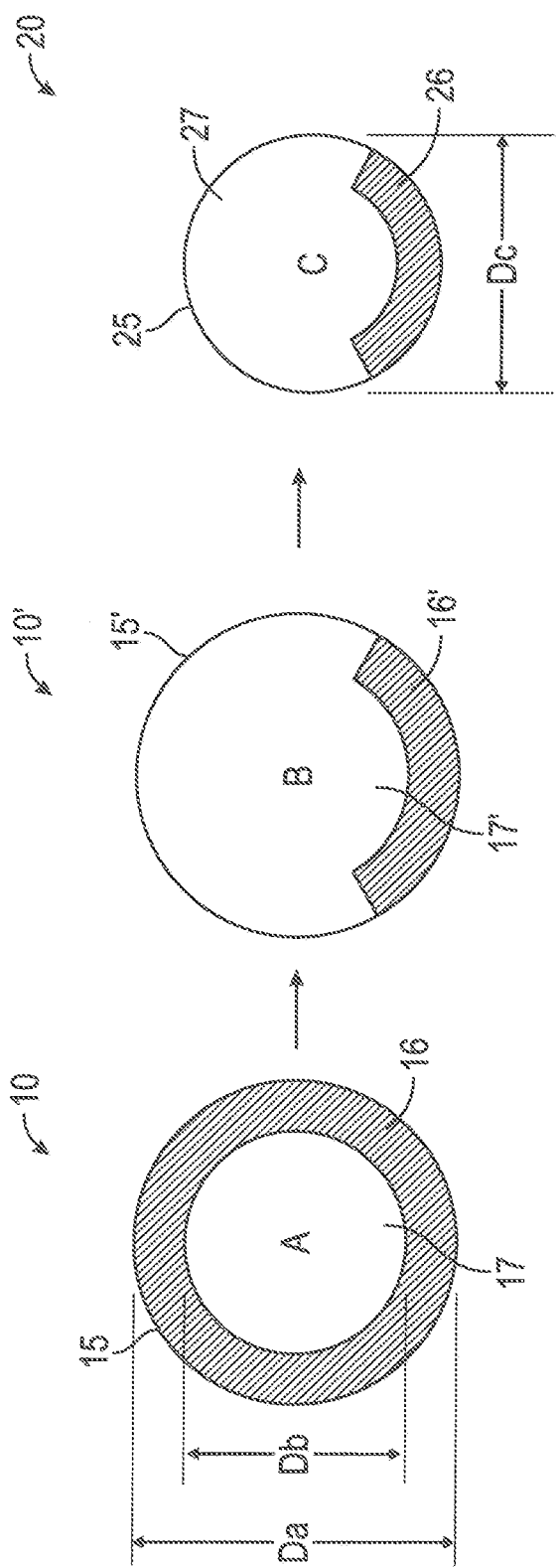

HIGH SPEED PHOTO DETECTORS WITH REDUCED APERTURE METAL CONTACT AND METHOD THEREFOR

RELATED APPLICATIONS

This patent application is related to U.S. Provisional Application No. 62/777,851 filed Dec. 11, 2018, entitled "HIGH SPEED PHOTO DETECTORS WITH REDUCED APERTURE METAL CONTACT" in the names of Yi-Ching Pao, Majid Riaziat and Ta-Chung Wu, and which is incorporated herein by reference in its entirety. The present patent application claims the benefit under 35 U.S.C § 119(e).

TECHNICAL FIELD

The present invention generally relates to photodiodes and, more particularly to, a photodiode and method that allows one to a arrange a top aperture metal shape and form in order to obtain higher operation frequencies for the photodiode.

BACKGROUND

A photodiode may be defined as a semiconductor device that converts light into an electrical current. Most photodiodes may be formed of a semiconductor material and contains a p-n junction or PIN structure. Current may be produced in the photodiode when photons are absorbed and moved from the depletion region of the p-n junction by a built-in electric field of the depletion region.

Traditional photodiodes of both the PIN and avalanche designs may be formed by an etch mesa with a metal contact ring on the top of the mesa. The metal contact ring may be used to not only make the needed electrical connection to the semiconductor top layer but also to form an aperture of the photodiode. The aperture may be used to allow the light signal to enter the photodiode.

At lower frequency operation, for example <1 GHz, the mesa size of the photodiode can be relatively large in the 100 um range. The metal ring formed on top of the mesa is typically limited by the photolithography and lift-off process. For the lower frequency operation, the metal ring may be in the range of around 5 um. The aperture formed in the metal ring, which is used to allow the incoming light signal to enter the photodiode, may be partially block by the ring metal contact. This may impact the speed performance of the photodiode. For lower frequency operation, the impact may not be significant. However, when the data rate of the photodiode increases, the mesa size needs to be decreased to reduce the photodiode capacitance. Photodiode capacitance is predominately controlled by the mesa size and the thickness of the photon absorption region. With the smaller mesa size, the impact of the aperture side metal contact may become important.

When the photodiode is operating at a frequency of 25G, as an example, the mesa size needs to be reduced to 20-30 um. Thus, putting the metal ring size (if it remains at 5 um) comparable to the aperture size. This means that if one wants to maximize the photodiode operating frequency, one must either reduce the metal ring size or re-arrange the aperture metal shape or form in order to achieve such objective.

Therefore, it would be desirable to provide a device and method that overcome the above problems. The device and method would allow one to a arrange a top aperture metal shape and form in order to obtain higher operation frequencies for the photodiode.

SUMMARY

In accordance with one embodiment, a photodiode is disclosed. The photodiode has a substrate. A mesa structure is formed on the substrate. The mesa structure has an n region containing an n type dopant formed on the substrate, an intermediate region positioned on the n region, and a p region formed on the intermediate region and containing a p type dopant. A contact is formed on a top surface of the mesa and attached to the p region. The contact is formed around an outer perimeter of the mesa. The mesa has a diameter of 30 um or less.

In accordance with one embodiment, a photodiode is disclosed. The photodiode has a substrate. A mesa structure is formed on the substrate. The mesa structure has an n region containing an n type dopant formed on the substrate, an intermediate region positioned on the n region, and a p region formed on the intermediate region and containing a p type dopant. A contact is formed on a top surface of the mesa and attached to the p region. The contact is formed around one third of an outer perimeter of the mesa. The contact is formed of a plurality of sections, each of the plurality of sections is coupled together.

In accordance with one embodiment, a photodiode is disclosed. The photodiode has a substrate. A mesa structure is formed on the substrate. The mesa structure has an n region containing an n type dopant formed on the substrate, an intermediate region positioned on the n region, and a p region formed on the intermediate region and containing a p type dopant. A contact is formed on a top surface of the mesa and attached to the p region. The contact is formed around one third of an outer perimeter of the mesa. The contact is formed of a plurality of sections. Each of the plurality of sections is equal in size, a length of each of the plurality of sections is greater than a width of each of the plurality of sections. Each of the plurality of sections is coupled together. The mesa has a diameter of 30 um or less.

BRIEF DESCRIPTION OF THE DRAWINGS

The present application is further detailed with respect to the following drawings. These figures are not intended to limit the scope of the present application but rather illustrate certain attributes thereof. The same reference numbers will be used throughout the drawings to refer to the same or like parts.

FIG. 3A is a top view of a prior art photodiode;

FIG. 3B is a top view of a prior art photodiode;

FIG. 3C is a top view of the exemplary embodiment of the photodiode of FIG. 2 in accordance with one aspect of the present application;

DESCRIPTION OF THE APPLICATION

The description set forth below in connection with the appended drawings is intended as a description of presently preferred embodiments of the disclosure and is not intended to represent the only forms in which the present disclosure may be constructed and/or utilized. The description sets forth the functions and the sequence of steps for constructing and operating the disclosure in connection with the illustrated embodiments. It is to be understood, however, that the same or equivalent functions and sequences may be accomplished by different embodiments that are also intended to be encompassed within the spirit and scope of this disclosure.

The present invention deals with the high-speed photodiode and configuration designs which improves the RC time constants of the photodiode. This is especially applied to the InP based photodiode where the intrinsic series resistance is several times of the contact metal resistances. The present invention could improve the RC time constant of a high-speed photodiode by ⅓ or more as a result of simple layout and configuration change.

The present invention allows one to arrange a top aperture metal shape and form on a mesa of a photodiode in order to achieve higher operation frequency in the photodiode. The operation frequency of a photodiode is normally controlled by two time constants, namely (1) transit time, and (2) RC charge and discharge time. The present invention does not alter or change the transit time constant but rather focuses on the RC time constant alone.

In a typical RC (resistance-capacitance) circuit, the times to charge the capacitor and the time to discharge the capacitor may be defined as the RC time constant of the circuit. The elements of a photodiode resistance may include the following: (1) top metal contact resistance Rt, the photodiode intrinsic series resistance Ri, and the back or bottom metal contact resistance Rb. The photodiode capacitance is mainly the parallel plate capacitance that is formed through semiconductor structure. This parallel plate capacitance may be controlled by (1) mesa size and (2) the intrinsic "I" layer thickness.

Figure 1:
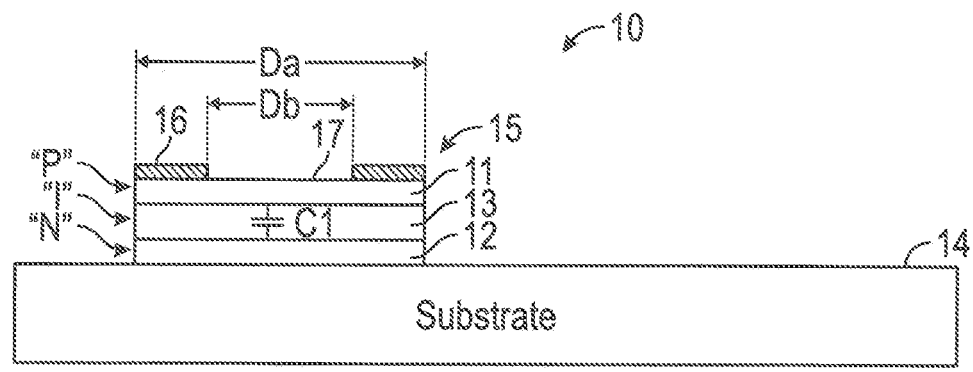
FIG. 1 is a cross-sectional view of a prior art photodiode.

Referring to FIG. 1, a prior art photodiode 10 may be seen. The photodiode 10 may have three main layers: a p layer 11, an n layer 12, and an intermediate (intrinsic) layer 13 formed on a substrate 14. The p and n layers 11 and 12 may be doped to high carrier concentrations while the intermediate layer 13 may be unintentionally doped to have a small, residual p or n type carrier concentration. The p and n layers 11 and 12 act as electrodes while the intermediate layer 13 serves as an energy storage dielectric medium. The parallel plate capacitors formed with the P-I-N structure may be denoted as "C1". A mesa 15 may be formed/etched. The mesa 15 may have a width of Da. A ring contact 16 may be formed on and/or connected to the p layer 11. The ring contact 16 may have an aperture 17 having a diameter Db. The aperture 17 may be used to allow the incoming light signal to enter the photodiode 10.

Figure 2:
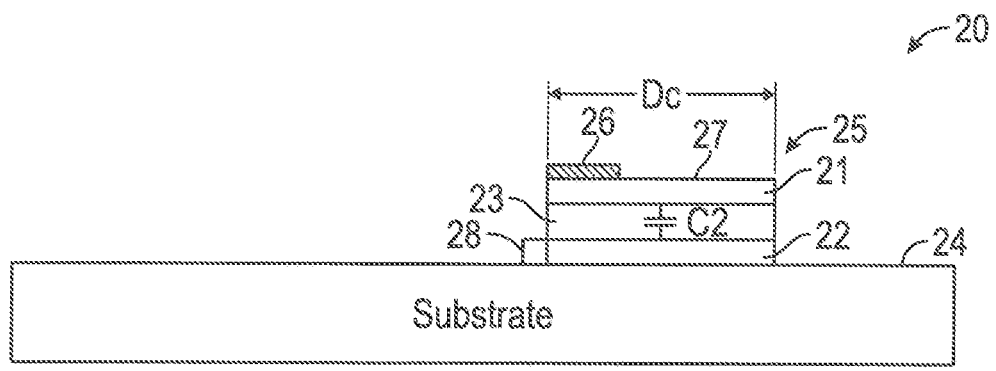
FIG. 2 is a cross-sectional view of an exemplary embodiment of a photodiode in accordance with one aspect of the present application.

Referring to FIG. 2, a photodiode 20 of the present invention may be seen. The photodiode 20 may have three main layers: a p layer 21, an n layer 22, and an intermediate (intrinsic) layer 23 formed on a substrate 24. The p and n layers 21 and 22 may be doped to high carrier concentrations while the intermediate layer 23 may be unintentionally doped to have a small, residual p or n type carrier concentration. The p and n layers 21 and 22 act as electrodes while the intermediate layer 23 serves as an energy storage dielectric medium. The parallel plate capacitors formed with the P-I-N structure may be denoted as "C2". A mesa 25 may be formed/etched. The mesa may have a width Dc which is smaller than the width Da of the prior art photodiode 10. In accordance with one embodiment, the Dc may be in a rage of 20-30 um or less. A contact 26 may be formed on and/or connected to the p layer 21. The contact 26 may have an opening 27. The opening 27 may be used to allow the incoming light signal to enter the photodiode 20. The photodiode 20 may be configured so that the capacitance C2 is smaller than the C1 of FIG. 1 while the opening 27 has a same/similar are as the aperture 18.

The RC time constant of a photodiode may be defined by $(Rt+Ri+Rb) \times C2$ wherein Rt may be the top metal contact resistance, Ri may be the photodiode intrinsic series resistance, and Rb may be the back or bottom metal contact resistance. By reducing the contact area of the top contact, the contact resistance Rt may be affected. Typically, in semiconductor devices the contact resistance is inversely proportional to the contact area. The same effect may be true for the area affecting the capacitance of the photodiode which has only one component and not three like the resistance. Thus, by reducing the area of the top metal contact of the photodiode by ⅔, one may increase the top contact resistance by 3X, then the total resistance becomes 3Rt instead of Rt.

When the aperture size reduces to a certain level say 20 um and with the top contact ring of 5 um is used, then the total area of the top metal is 1.25× of the aperture area. Thus, by reducing the contact metal area by ⅔ then the capacitance, which is directly proportional to the mesa area will be almost reduced in half giving a resulting capacitance of ½ C. Thus, the overall RC time constant of the photodiode may become $(3Rt+Ri+Rb) \times ½ C$. Typically, Rb is small compares to Rt and Ri so in the present embodiment, one can ignore it. Since Ri is the reversed biased intrinsic layer resistance, it may be 5 times the value of Rt. Thus, the RC time constant may become $(3Rt+5Rt) \times ½ C = 4RtC$. This is to be compare with the original structure of $(Rt+5Rt) \times C = 6RtC$. This means the new design approach will reduce the total RC time constant by ⅓ from 6RtC to 4RtC. In a photodiode where the operation frequency is mainly controlled by the RC time constant, this may mean a 33% increase of the operation frequency may be achieved by the new design approach. This improvement is much more meaningful in InP based photodiodes than GaAs one since for InP based photodiodes, the intrinsic series resistance Ri is several times of the contact resistances of Rt and Rb as described above.

The present invention addresses mainly the geometric and layout configurations that may achieve the design objectives by reducing the top metal area (i.e., minimize the light blocking area) but at the same maintain the best contact arrangement to even out the electron-hole collections through the ohmic metal contacts. In theory the best layout geometry remains to be a circular one since the collection of the photons generated by the electron-hole may be symmetrically collected over the full circle of 360 degrees. However, when the device line feature size shrinks down to certain level (2-3 um as an example) then it may become hard to make proper connection to the line without sacrificing certain side effects. Thus, if one wants to maintain the minimum line feature size of 5 um then the line must be broken down into piece wise configuration as discussed below.

Referring now to FIGS. 3A-3C, a comparison of the aperture size versus a top metal contact arrangement may be seen. FIG. 3A show a top view of the prior art photodiode 10 of FIG. 1. The photodiode 10 may have the mesa 15 formed having the width of Da. The ring contact 16 forms the aperture 17 having a diameter Db and a size/area A.

In FIG. 3B, a top view of another embodiment of a prior art photodiode 10' may be seen. In this embodiment, the photodiode 10' is similar to the photodiode 10. However, in the photodiode 10' the contact 16' has been reduced in contact area size by two-thirds as compared to the ring contact 16 of the photodiode 10. The contact 16' may be a semi-circular contact that is formed around a portion of the perimeter of the mesa 15'. By reducing the size of the contact 16', the size of the aperture 17' may increase in size of the aperture to a size/area B as compared to the size/area A of the photodiode 10.

Referring to FIG. 3C, a top view of the photodiode 20 may be seen. The photodiode 20 may have the mesa 25 formed having the width of Dc. In accordance with one embodiment, the De may be in a rage of 20-30 um or less. The contact 26 may be formed on a top surface of the mesa 25. The contact 26 may be a semi-circular ring in form and may be applied to an outer perimeter of the top surface of the mesa 25. In accordance with one embodiment, the contact 26 may be a semi-circular ring which may encircle approximately one third of the outer perimeter of the mesa 25. The contact 26 may forms the aperture 27 having a size/area C. By increasing the size of the aperture 18' of the photodiode 10' in FIG. 3B, one may reduce the size of the mesa 15' from a diameter of Db to a diameter of Dc as shown in FIGS. 2 and 3C with the aperture 27 having a size/area C approximately equal in size/area to the aperture 18 having a size/area A. The photodiode 20 may thus have an aperture 27 with a similar size/area to the aperture 17 of the photodiode 10, but with a smaller diameter mesa 25. The smaller size mesa 25 may allow the photodiode 20 to have a lower capacitance level.

Figure 4A:
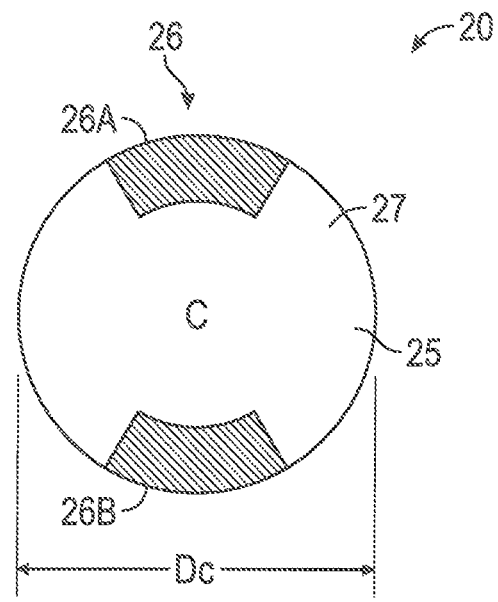
FIG. 4A is a top view of an exemplary embodiment of a photodiode in accordance with one aspect of the present application.

Referring now to FIG. 4A, the contact 26 located on a top surface of the mesa 25 may be broken into a piece wise configuration. In the present embodiment, contact 26 may be broken into two sections 26A and 26B. Each section 26A and 26B of the contact 26 may be approximately equal in size. The combined length of the sections 26A or 26B should be less than or equal to the total length of the contact 26. In the present embodiment, each section 26A and 26B may be a semi-circular ring which may encircle approximately one sixth of the outer perimeter of the mesa 25. Each section 26A and 26B should not be shorter than a width of a single section 26A or 26B.

Figure 4B:
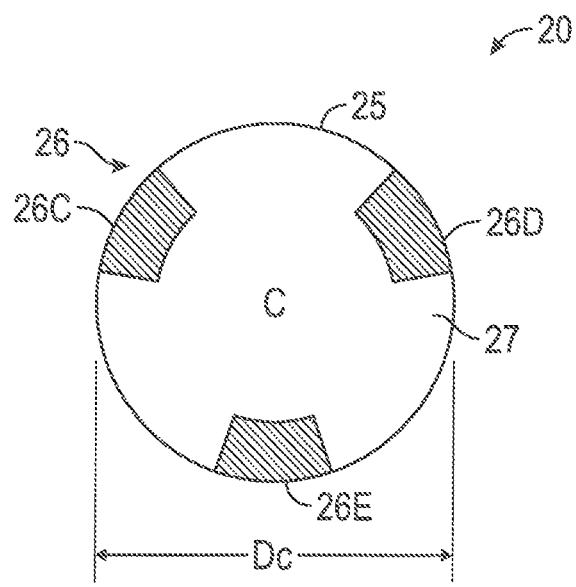
FIG. 4B is a top view of an exemplary embodiment of a photodiode in accordance with one aspect of the present application.

Referring now to FIG. 4B, the contact 26 located on a top surface of the mesa 25 may be broken into a piece wise configuration. In the present embodiment, contact 26 may be broken into three sections 26C, 26D, and 26E. Each section 26C, 26D and 26E of the contact 26 may be approximately equal in size. The combined length of the sections 26C, 26D and 26E should be less than or equal to the total length of the contact 26. In the present embodiment, each section 26C, 26D, and 26E may be a semi-circular ring which may encircle approximately one ninth of the outer perimeter of the mesa 25. Each section 26C, 26D and 26E should not be shorter than a width of a single section 26C, 26D or 26E.

When the contact 26 is broken into piece wise configuration as shown in FIGS. 4A and 4B, extra connections to each and every section of the contact 26 may be required. The extra connections may be done by having a connection network 28 (see FIG. 2) formed outside of the area of the mesa 25. Since outside the area of the mesa 25 are electrical insulated, on top of the semi-insulated substrate 24, the connection network can be easily arranged without causing any unwanted parasitic effects such as potential leakage current path or extra parasitic capacitance.

Figure 5A:
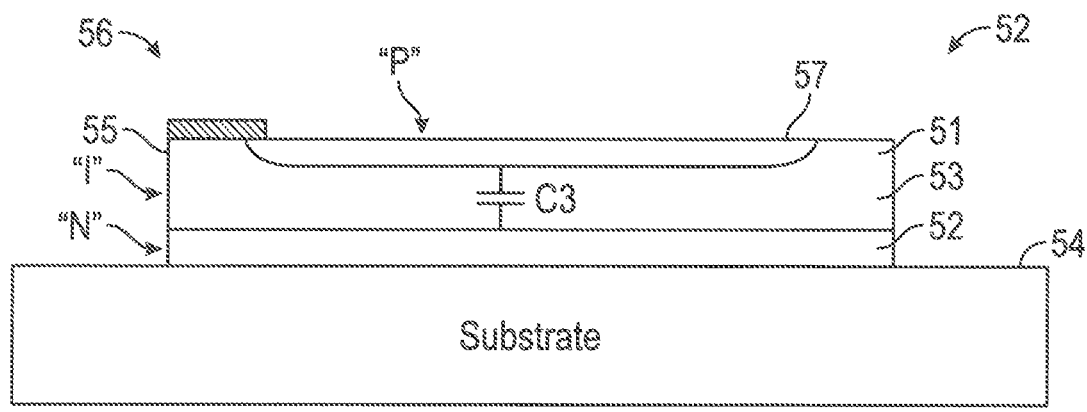
FIG. 5A is a cross-sectional view of an exemplary embodiment of a photodiode in accordance with one aspect of the present application.
Figure 5B:
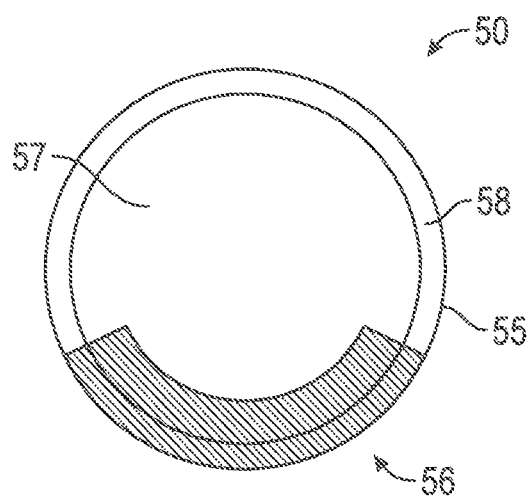
FIG. 5B is a top view of an exemplary embodiment of the photodiode of FIG. 5A in accordance with one aspect of the present application.

Referring to FIGS. 5A-5B, the present invention not only can apply to epi-based photodiode structures of either PIN or APD (avalanche photodiode) as disclosed and shown above, but can also apply to Zn diffused photodiodes 50. The Zn diffused photodiode 50 may have a p region 51, an n region 52, and an intermediate (intrinsic) region 53 formed on a substrate 54. The p and n regions 51 and 52 may be doped to high carrier concentrations while the intermediate region 53 may be unintentionally doped to have a small, residual p or n type carrier concentration. The p and n regions 51 and 52 may act as electrodes while the intermediate layer 53 serves as an energy storage dielectric medium. The p region 51 may be formed by diffusing Zinc into the semiconductor with a "bath tub" diffusion profile. Thus, the P-I-N region is no longer controlled or constrained by the etched mesa but by the profile of Zinc diffusion fronts.

The parallel plate capacitors formed with the P-I-N structure may be denoted as "C3". A mesa 55 may be formed/etched. A contact 56 may be formed on and/or connected to the p region 51. The contact 56 may have an aperture 57. The aperture 57 may be used to allow the incoming light signal to enter the photodiode 10.

Since the capacitance of the Zn diffused photodiode 50 may be defined by the Zinc diffusion profile, and the adjacent intermediate region 53 is electrically inert (i.e., insulated), the connection network 58 of the one or more sections of the piece wise segments of the contact 56 can be place on the top of the mesa 55 just outside the Zinc diffused area instead of outside of the mesa area where the connection networks have to go over the etched step of the mesa 55.

Figure 6A:
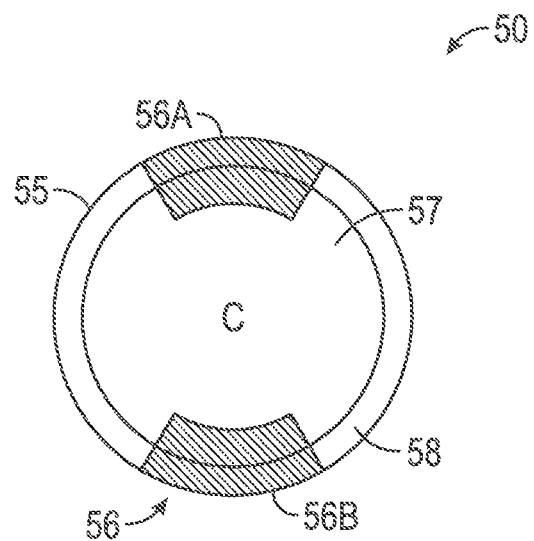
FIG. 6A is a top view of an exemplary embodiment of a photodiode in accordance with one aspect of the present application.

Referring now to FIG. 6A, the contact 56 located on a top surface of the mesa 55 may be broken into a piece wise configuration. In the present embodiment, the contact 56 may be broken into two sections 56A and 56B. Each section 56A and 56B of the contact 56 may be approximately equal in size. The combined length of the sections 56A or 56B should be less than or equal to the total length of the contact 56. In the present embodiment, ach section 56A and 56B may be a semi-circular ring which may encircle approximately one sixth of the outer perimeter of the mesa 55. Each section 56A and 56B should not be shorter than a width of a single section 56A or 56B. The connection network 58 may be used to connect each section 56A and 56B together. The connection network 58 can be place on the top of the mesa 55 just outside the Zinc diffused area.

Figure 6B:
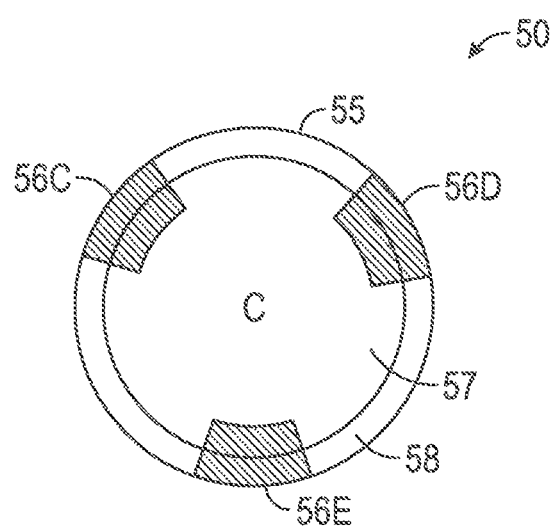
FIG. 6B is a top view of an exemplary embodiment of a photodiode in accordance with one aspect of the present application.

Referring now to FIG. 6B, the contact 56 located on a top surface of the mesa 55 may be broken into a piece wise configuration. In the present embodiment, contact 56 may be broken into three sections 56C, 56D, and 56E. Each section 56C, 56D and 56E of the contact 56 may be approximately equal in size. The combined length of the sections 56C, 56D and 56E should be less than or equal to the total length of the contact 56. In the present embodiment, each section 56C, 56D, and 56E may be a semi-circular ring which may encircle approximately one ninth of the outer perimeter of the mesa 55. Each section 26C, 26D and 26E should not be shorter than a width of a single section 26C, 26D or 26E. The connection network 58 may be used to connect each section 56C, 56D, and 56E together. The connection network 58 can be place on the top of the mesa 55 just outside the Zinc diffused area.

While embodiments of the disclosure have been described in terms of various specific embodiments, those skilled in the art will recognize that the embodiments of the disclosure may be practiced with modifications within the spirit and scope of the claims

What is claimed is:

1. A photodiode comprising:
 a substrate;
 a mesa structure formed on the substrate, wherein the mesa structure comprises:
 an n region containing an n type dopant formed on the substrate:
 an intermediate region positioned on the n region;
 a p region formed on the intermediate region and containing a p type dopant, wherein the p region is a zinc diffused p region;
 a connection mechanism is formed on the top surface of the mesa and outside of the zinc diffused p region; and
 a contact formed on a top surface of the mesa and attached to the p region,
 wherein the contact is formed around an outer perimeter of the mesa,
 wherein the mesa has a diameter of 30 μm or less, and
 wherein the contact has a line size of 5 μm, the contact is formed of a plurality of sections equally spaced around the outer perimeter of the mesa and covers only one-third of the outer perimeter.

2. The photodiode of claim 1, wherein the contact is formed of three sections, each of the three sections being equal in size, the three sections being equally spaced around the outer perimeter, each of the three sections covering only one-ninth of the outer perimeter.

3. The photodiode of claim 2, comprising connection mechanism coupling each of the three sections together.

4. The photodiode of claim 1, wherein the photodiode operates at a frequency of 25 GHz.

5. The photodiode of claim 4, wherein the contact is formed of three sections, each of the three sections being equal in size, the three sections being equally spaced around the outer perimeter, each of the three sections only covering one-ninth of the outer perimeter.

6. The photodiode of claim 4, wherein the contact is formed of two sections.

7. The photodiode of claim 6, wherein a total length of the plurality of the three sections is less than or equal to one third of the outer perimeter of the mesa.

8. The photodiode of claim 6, comprising connection mechanism coupling each of the two sections together.

9. The photodiode of claim 6, wherein each of the two sections is equal in size and covers only one-sixth of the outer perimeter.

10. The photodiode of claim 9, wherein a length of each of the two sections is greater than a width of each of the two sections.

11. A photodiode comprising:
 a substrate;
 a mesa structure formed on the substrate, wherein the mesa structure comprises:
 an n region containing an n type dopant formed on the substrate;
 an intermediate region positioned on the n region;
 a p region formed on the intermediate region and containing a p type dopant, wherein the p region is a zinc diffused p region;
 a connection mechanism formed on the top surface of the mesa and outside of the zinc diffused p region; and
 a contact formed on a top surface of the mesa and attached to the p region,
 wherein the contact has a line size of 5 μm and is formed around one-third of an outer perimeter of the mesa,
 wherein the contact is formed of a plurality of sections,
 wherein each of the plurality of sections is equal in size, a length of each of the plurality of sections is greater than a width of each of the plurality of sections,
 wherein each of the plurality of sections is coupled together, and
 wherein the mesa has a diameter of 30 μm or less.

12. The photodiode of claim 11, comprising a connection mechanism coupling each of the plurality of sections together.

13. A photodiode comprising:
 a substrate;
 a mesa structure formed on the substrate and having a diameter of 30 μm or less, wherein the mesa structure comprises:
 an n region containing an n type dopant formed on the substrate;
 an intermediate region positioned on the n region;
 a p region formed on the intermediate region and containing a p type dopant, wherein the p region is a zinc diffused p region;
 a connection mechanism is formed on the top surface of the mesa and outside of the zinc diffused p region; and
 a contact formed on a top surface of the mesa and attached to the p region,
 wherein the contact has a line size of 5 μm and is formed around one-third of an outer perimeter of the mesa, and
 wherein the contact is formed of three sections, each of the three sections being equal in size, the three sections being equally spaced around the outer perimeter, each of the three sections covering one-ninth of the outer perimeter.

14. The photodiode of claim 13, comprising a connection mechanism coupling each of the three sections together.

* * * * *